United States Patent
Spehar et al.

(10) Patent No.: US 8,482,114 B2
(45) Date of Patent: Jul. 9, 2013

(54) IMPEDANCE OPTIMIZED CHIP SYSTEM

(75) Inventors: James Raymond Spehar, Chandler, AZ (US); Christian Paquet, Cupertino, CA (US); Wayne A. Nunn, Hidden Valley Lake, CA (US); Dominicus M. Roozeboom, San Jose, CA (US); Joseph E. Schulze, Chandler, AZ (US); Fatha Khalsa, San Jose, CA (US)

(73) Assignee: NXP B.V., Eindhoven (NL)

( * ) Notice: Subject to any disclaimer, the term of this patent is extended or adjusted under 35 U.S.C. 154(b) by 381 days.

(21) Appl. No.: 12/757,466

(22) Filed: Apr. 9, 2010

(65) Prior Publication Data

US 2011/0057302 A1  Mar. 10, 2011

Related U.S. Application Data

(60) Provisional application No. 61/241,326, filed on Sep. 10, 2009.

(51) Int. Cl.
*H01L 23/48* (2006.01)

(52) U.S. Cl.
USPC ............... 257/693; 438/111; 333/32; 333/33

(58) Field of Classification Search
USPC .................. 257/693; 438/111; 333/32, 33
See application file for complete search history.

(56) References Cited

U.S. PATENT DOCUMENTS

| | | | |
|---|---|---|---|
| 5,498,767 A | 3/1996 | Huddleston et al. | |
| 5,532,934 A | 7/1996 | Rostoker | |
| 6,469,383 B1 | 10/2002 | Welstand | |
| 7,411,471 B2 * | 8/2008 | Tsukahara | 333/104 |
| 8,193,091 B2 | 6/2012 | Kawai et al. | |
| 2002/0125555 A1 * | 9/2002 | Akiyama et al. | 257/685 |
| 2004/0140860 A1 * | 7/2004 | Miller | 333/33 |
| 2009/0130996 A1 * | 5/2009 | Kudaishi et al. | 455/90.3 |
| 2009/0195325 A1 | 8/2009 | Menon | |

FOREIGN PATENT DOCUMENTS

| | | |
|---|---|---|
| EP | 1 328 023 A2 | 7/2003 |
| JP | 2002-064346 A | 2/2002 |

OTHER PUBLICATIONS

"Extended European Search Report (EESR)" dated Aug. 25, 2011 for Application No. 10176196.3.

* cited by examiner

*Primary Examiner* — A. Sefer
*Assistant Examiner* — Farid Khan

(57) ABSTRACT

A high bandwidth circuit is segmented into a plurality of portions, each portion for implementation on a corresponding semiconductor chip, an arrangement of one or more die bond pads for each corresponding chip is generated, and a chip location for each corresponding chip is generated, given package and given package I/O arrangement is generated, the generation of the die bond arrangements and the chip position being relative to given chip package parameters, and being generated to establish bond wire lengths meeting given characteristic impedance parameters. Boundary parameters for generating the segmenting are provided, including a bound on the number of portions and optionally a including bound on the area parameters of the corresponding semiconductor chips.

9 Claims, 16 Drawing Sheets

IMPEDANCE OPTIMIZED CHIP SYSTEM

TECHNICAL FIELD

Embodiments relate to the segmentation and topology of circuits on semiconductor chips and the packaging of chips.

BACKGROUND

Electronic communication systems provide for distribution and exchange of information between system connection points among nodes by modulating an electromagnetic signal to have a particular state in a given coding state space, or to pass through particular changes in states, the state or change in state(s) representing a particular symbol, each symbol encoding one or more bits of information, and then propagating the modulated signal over wireless links and/or through non-wireless transmission paths such as, for example, printed circuit board (PCB) traces, repeater/amplifiers, multiplexers and other switches, to arrive at various destinations.

Switches within an electronic communication system may include Q:R switches, meaning Q inputs and R outputs, where Q and R may or may not be equal to one another. For example, a 1:2 switch may have one input line, or one multi-line input bus, and two output lines, or two multi-line output busses.

A typical Q:R switch circuit fabricated in conventional technology is a single integrated circuit (IC) chip, the IC chip having conducting input/out (I/O) terminals that are connected to particular circuit terminal points (e.g., R buffer outputs, Q buffer inputs, $V_{CC}$, GND, and control lines) via IC internal conductor traces. The IC chip is typically mounted in a package, the package having external conducting terminals for connection to, for example, a printed circuit board (PCB) and the package having internal conducting terminals connected to the package's external conducting terminals via, for example, conductor traces in the package. Each of the package internal conducting terminals is, in turn, connected, via one of several known conductor means, to one or more corresponding chip I/O terminals.

One means for connecting the package internal terminals to the IC chip I/O terminals consists of a plurality of thin conducting wires, each bond wire bonded at one end to one of the IC chip I/O terminals and bonded at the other end to one of the package internal terminals. This means is referred to as "bond wire." In typical bond wire arrangements, the IC chip I/O terminals and the package internal I/O terminals have both a configuration and a material that is particularly suited to bonding to the wire. These terminals are generically referenced in this description as "bond pads."

As integrated circuit (IC) processes have advanced, feature sizes have become smaller and, in turn, this has allowed practical implementation of entire functions, e.g., Q:R switches, on a single die. Further, the smaller feature sizes provided by advances in IC technology not only permit forming the entire circuit on a single die but, also, have reduced the dimensions and area of the die. Conventional design practice has therefore employed these advances in IC technology, in accordance with its conventional approach to providing increased density and increased bandwidth, to implement functions having a plurality of high bandwidth input/output lines such as, for example, Q:R switches and other similar and equivalent circuits, on a single IC die.

The present inventors have identified, though, that the single die solutions to density and cost objectives, particularly combined with standardized packages have inherent shortcomings including, for example, a not readily controllable I/O port impedance, with related shortcomings including, for example, skew and impedance mismatch.

SUMMARY

Exemplary embodiments provide, among various benefits, advantages and features, novel packaged IC circuits having a plurality of well-controlled characteristic impedance I/O ports, without requiring added impedance matching structure.

Exemplary embodiments provide, among various benefits, advantages and features, novel methods for implementing circuits having a plurality of I/O ports in packaged IC circuits that provide the I/O ports with well-controlled characteristic impedance, without requiring added impedance matching structure.

Various exemplary embodiments provide packaged IC circuits having a plurality of I/O ports, each providing a substantially continuous characteristic impedance $Z_0$, with $Z_0$ being selectable.

Various embodiments further provide, among other features and benefits, signal transmission paths between various package external I/O terminals, each path including one or more bond wires and, concurrently, each path having a substantially higher bandwidth than attainable with prior art chip and packaging technologies.

Various embodiments also provide, among other features and benefits, substantial reduction in wire sweep, concurrent with providing bond-wire paths having optimized characteristic impedance and, therefore, higher bandwidth.

Various embodiments further provide, among other features and benefits, substantial reduction in cost and in wire sweep, combined with bond-wire paths having optimized characteristic impedance and, therefore, high bandwidth.

One example implementation according to various exemplary embodiments includes a package having a chip support surface and having structure supporting a plurality of package first conductor pads and a plurality of package second conductor pads, each package first conductor pad located at a corresponding position on the package and each package second conductor pad located at a corresponding position on the package, a first semiconductor chip and a second semiconductor chip, each supported at a corresponding position and orientation on the chip support surface, the first semiconductor chip including a first circuit segment of a given circuit and having a plurality of first chip conductor pads disposed on an external surface of the first semiconductor chip, each of the first chip conductor pads located at a corresponding position on the first semiconductor chip and each connected to the first circuit segment, and the second semiconductor chip including a second circuit segment of the given circuit and at least one second chip conductor pad connected to the second circuit segment and located at a corresponding position on the second semiconductor chip. Further to one or more example implementations according to various exemplary embodiments, a plurality of first bond wires connects a corresponding plurality of the first chip conductor pads to a corresponding plurality of the package first conductor pads, and at least one second bond wire connects at least one second chip conductor pad to a corresponding one of the package second conductor pads.

Further to example implementations according to various exemplary embodiments, the length of each first bond wire corresponds to a distance between the package first conductor pad at one end of the first bond wire and the first chip conductor pad connected at the other end of the first bond wire, and the length of each second bond wire corresponds to a distance between the package second conductor pad at one end of the second bond wire and the second chip conductor pad connected at the other end of the second bond wire.

Further to example implementations according to various exemplary embodiments, a relation of and among the position and orientation of the first semiconductor chip to the position and orientation of the second semiconductor chip, and to the corresponding position of each of the package first conductor pads, the package second conductor pads, the first chip conductor pads, and the second chip conductor pads results in a corresponding length of each of the first bond wires and the at least one second bond wire providing a characteristic impedance of each of the first bond wires and the at least one second bond wire being within a given tolerance of a given characteristic impedance $Z_0$.

One exemplary embodiment may include a method for providing a multi-chip signal communication circuit within a given package having a chip support substrate, the package supporting first terminals for carrying high bandwidth signals at a given characteristic impedance $Z_0$, and supporting a given plurality of second terminals for carrying low bandwidth signals, the method including providing a given signal communication circuit, assigning an initial segmentation of the signal communication circuit into an initial plurality of chips, at least one of the initial plurality of chips having an initial assignment of a plurality of high bandwidth bond wire pads, and assigning a location for at least one of the initial plurality of chips having an initial assignment of a plurality of high bandwidth bond wire pad, calculating a characteristic impedance for a bond-wire connection from each of the plurality of the high bandwidth bond-wire pads of the chip to a corresponding first terminal, comparing the calculating a characteristic impedance to a given characteristic impedance $Z_0$, laterally displacing the at least one chip; and repeating the calculating, comparing, and laterally displacing steps until either of the following conditions is detected: (i) the characteristic impedances are within a given tolerance from the given $Z_0$, or (ii) the given tolerance cannot be met using the initial segmentation.

According to another aspect, if condition (ii) is detected, an updating of the segmentation is performed to generate an updated plurality of chips, at least one of the updated plurality of chips having an initial assignment of a plurality of high bandwidth bond-wire pads and a repeating of the calculating the characteristic impedance and laterally displacing the at least one chip is performed, until either of the following conditions is detected: (i) the characteristic impedances are within a given tolerance from the given $Z_0$, or (ii) the given tolerance cannot be met using the updated segmentation. If condition (ii) is detected, performing the updating of the segmentation again and repeating the calculating, comparing, and laterally displacing steps until either of the following conditions is detected: (i) the characteristic impedances are within a given tolerance from the given $Z_0$, or (ii) the given tolerance cannot be met using the updated segmentation.

Contemplated applications of the various embodiments include, as illustrative example, switches used in high speed standards such as, but not limited to, PCIe, USB, SATA, HDMI, DisplayPort, Ethernet, MIPI, and V-by-One. Transmitters used in high speed standards such as, but not limited to, PCIe, USB, SATA, HDMI, DisplayPort, Ethernet, MIPI, and V-by-One. Inputs used in high speed standards such as, but not limited to, PCIe, USB, SATA, HDMI, DisplayPort, Ethernet, MIPI, and V-by-One. Line drivers used in high speed standards such as, but not limited, to PCIe, USB, SATA, HDMI, DisplayPort, Ethernet, MIPI, and V-by-One. Receivers used in high speed standards such as, but not limited, to PCIe, USB, SATA, HDMI, DisplayPort, Ethernet, MIPI, and V-by-One. Devices which would benefit from a cost reduction by reducing die area and bond wire length by implementing multiple segmented Die. Devices which would benefit from an improvement in manufacturing yield by using multiple segmented Die.

The above-summarized illustrative examples of embodiments and of illustrations, as well as the above illustrative advantages, features and benefits of each are not intended to be exhaustive or limiting. Other advantages of the various exemplary embodiments will be apparent from the various embodiments and aspects that are further described with illustrative detail, and persons of ordinary skill in the art will, upon reading this disclosure, readily identify further variations within the scope of the appended claims, as well as additional applications.

DETAILED DESCRIPTION

Various exemplary embodiments are described in reference to specific illustrative examples. The illustrative examples are selected to assist a person of ordinary skill in the art to form a clear understanding of, and to practice the various embodiments. However, the scope of systems, structures, devices and methods that may implement or practice according to one or more of the various embodiments is not limited to the specific illustrative examples that are presented. On the contrary, as will be readily recognized by persons of ordinary skill in the relevant arts based on this description, many other configurations, arrangements, and methods according to the various embodiments may be implemented.

With respect to the figures, for clarity of illustration certain portions or regions of one or more of the figures may be drawn not to scale. For example, for purposes of a clear depiction of a whole, certain depictions may have a distortion of shape and/or exaggeration of relative proportions.

To avoid obscuring novel features and aspects, various details of semiconductor circuit design and packaging that are well known to persons of ordinary skill in the arts are omitted, except where such details are particular to practicing according to the embodiments, or where examples of such details assist in describing particular features and aspects.

Example embodiments and aspects may be described separately, or as having certain differences, but such separate description or description of differences does not necessarily mean the respective embodiments or aspects are mutually exclusive. For example, a particular feature, function, or characteristic described in relation to one embodiment may be included in, or adapted for other embodiments.

Figure 1:
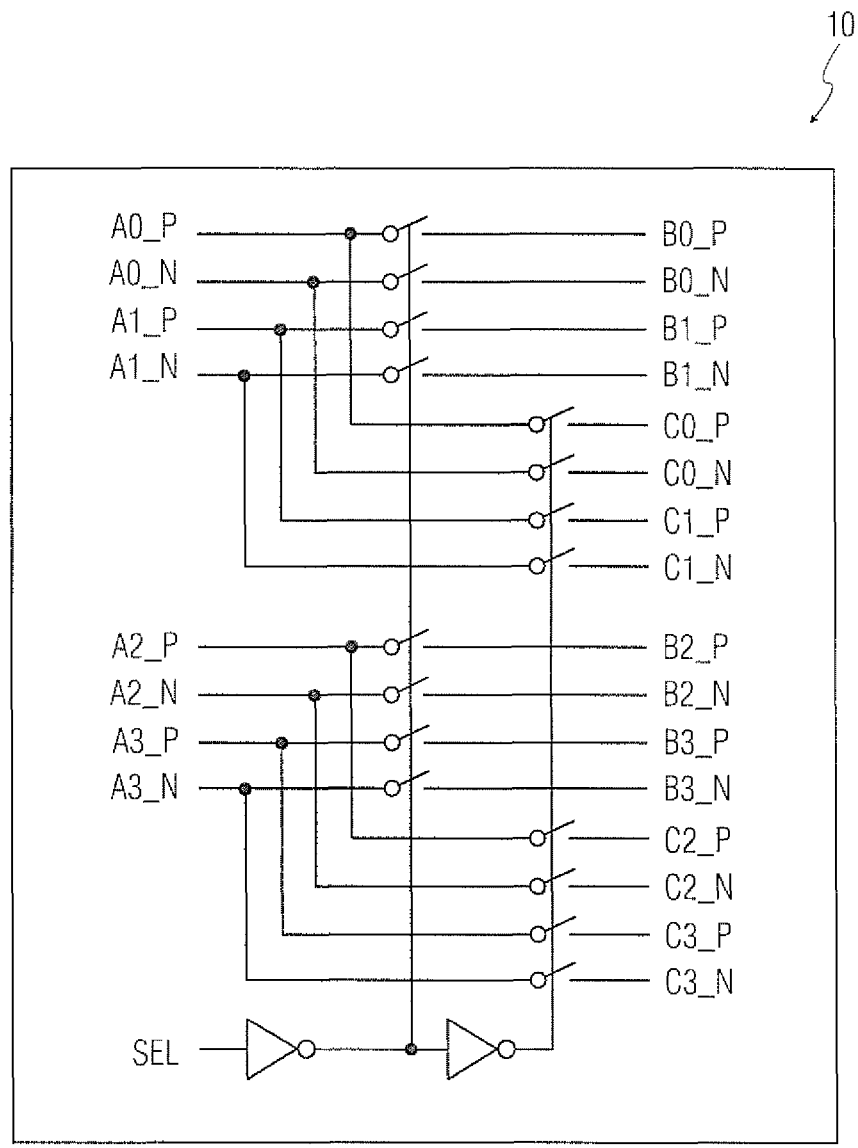
FIG. 1 depicts one illustrative high-level circuit diagram of an example conventional implementation of an example high bandwidth differential I/O Q:R switch.
Figure 2:
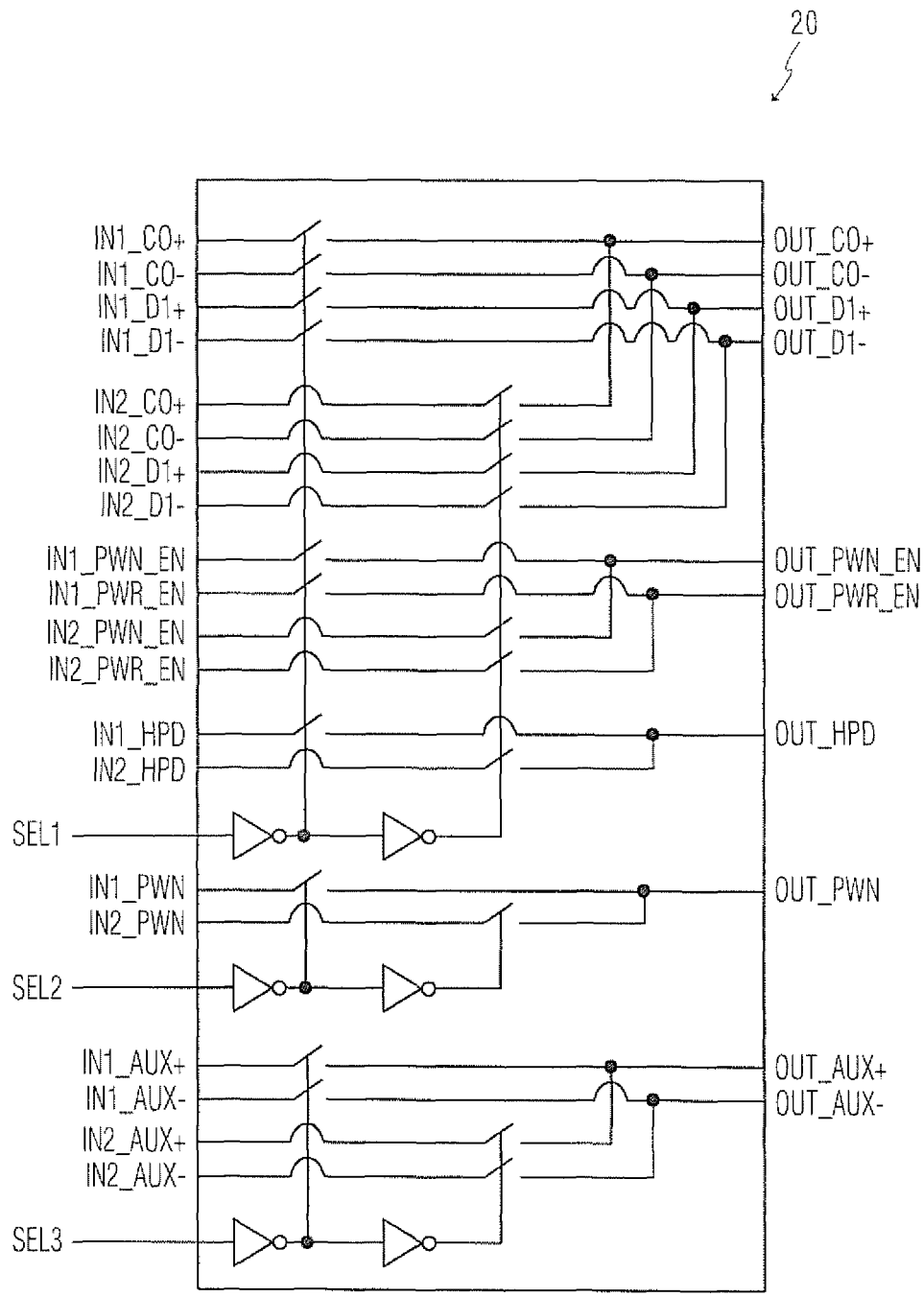
FIG. 2 depicts one illustrative high-level circuit diagram of other example conventional implementations of high bandwidth differential I/O Q:R switches, having illustrative examples of low speed control lines and illustrative examples of typical high bandwidth signal lines.
Figure 3:
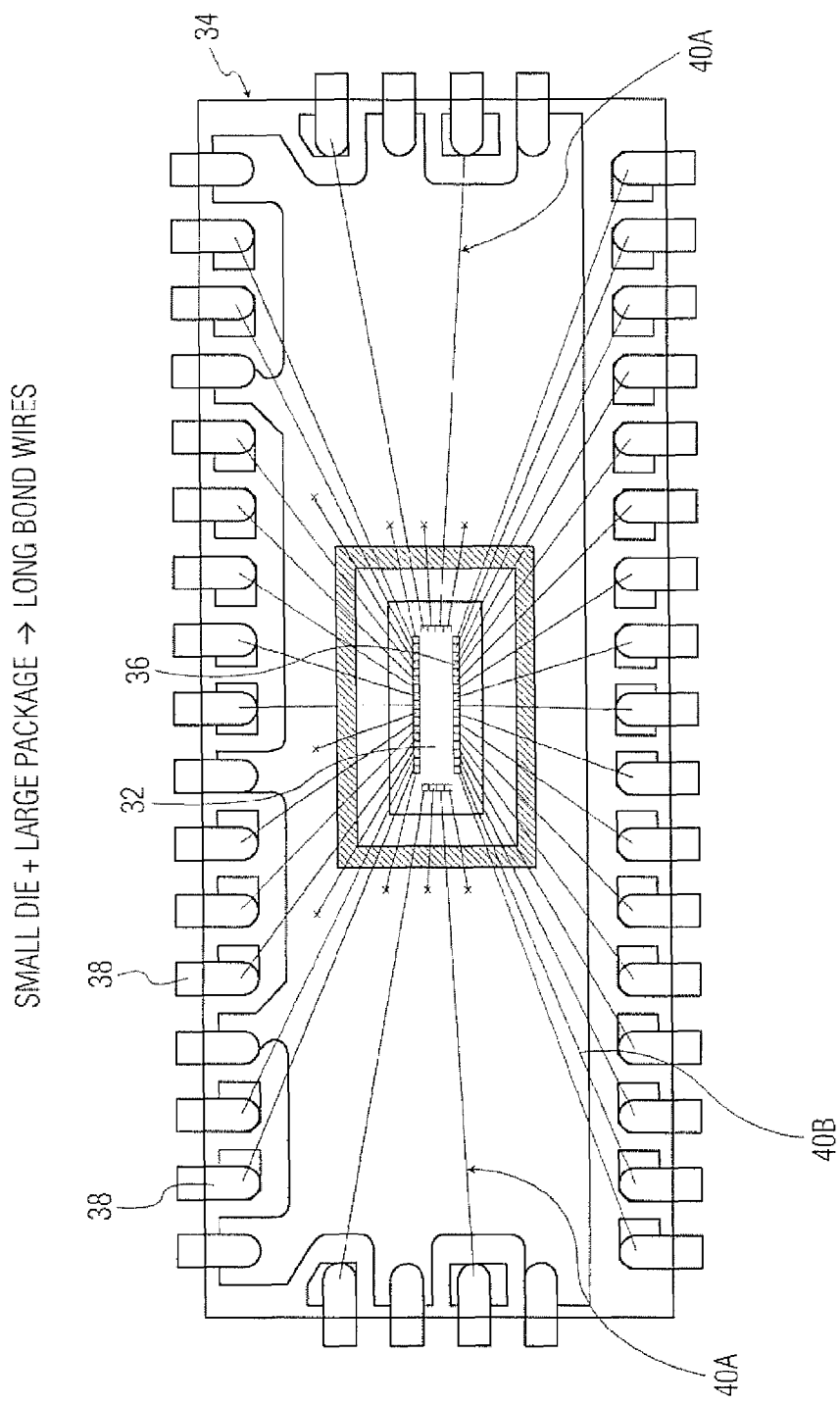
FIG. 3 shows one elevational view of one example conventionally implemented, packaged, high bandwidth Q:R switch.

FIGS. 1-3 depict various views of related stated-of-the-art high bandwidth circuits, each formed on a single IC chip, i.e., according to conventional design practice for applying advances in semiconductor technology, design and fabrication.

Turning to FIG. 1, depicted is a four-input differential line "A" bus, two four-output differential line busses, one being labeled a "B" bus and the other labeled a "C" bus, and a "SEL" control line that switches the "A" input bus between the "B" and "C" output busses. In accordance with conventional state-of-the-art design and fabrication of such switches, all of circuitry for the switch 10 is implemented on a single die (not explicitly shown in FIG. 1).

FIG. 2 is a high-level circuit diagram of another exemplar of a related art single die, high bandwidth differential I/O Q:R switch 20, having illustrative examples of low speed control and signal lines, labeled as "PWM," "HPD" and "AUX" and illustrative examples of typical high bandwidth signal lines, each labeled with a "D" suffix.

FIG. 3 shows an elevational view of an exemplar related art single-die, packaged, high bandwidth Q:R switch, which may, for example, be a packaged implementation of either the FIG. 1 or FIG. 2 switch.

Referring to FIG. 3, the present inventors have identified that the related art single die solutions to density and cost objectives, particularly combined with standardized packages such as the package 34 for the example die 32, have particular and various shortcomings. Among these shortcomings is no practical control of the impedance on the input/output (I/O ports) of circuits having a substantial number of such I/O ports, and a concomitant impedance mismatch. This is caused by the small size of the chip 32 necessitating some of the bond wires connecting the IC 32 bond pads 36 to the package leads 38, such as the examples 40A and 40B, being substantially longer than, even multiples of, the length of shorter bond wires such as 40C and 40D.

Referring still to FIG. 3, another shortcoming in the conventional state-of-the-art implementations identified by the present inventors is that the long bond wires often required in such technology, such as the example bond wires 40A and 40B, have an inherent tendency to increasing the incidence of shorts between adjacent bond wires, a condition known in the conventional arts as "wire sweep." This, in turn, often results in significant reduction in packaging yield, typically adding over 50% to the package cost.

As will be understood, various exemplary embodiments of the present invention, and aspects of each, provide an alternative high density and low cost implementation of IC circuits with multiple I/O ports, such as, for example X:Y switches, that is superior to conventional solutions such as depicted at FIG. 3.

Various exemplary embodiments include a novel segmentation of circuits having high bandwidth I/O lines into a plurality of two or segments, for fabrication on a corresponding plurality of two or IC dies, combined with a novel arrangement and positioning of the dies. As will be understood from this disclosure, various embodiments provide, among other features and benefits, control of characteristic impedance, compensation for parasitics, minimization of skew, as well as differences in skew, without requiring added impedance matching structure.

Various exemplary embodiments further provide various features and benefits including, for example, high signal integrity for signals transmitted and distributed through products at data rates greater than, for example, 1 Gbps, which are rates typically sensitive to the inductance, resistance and capacitance of their transmission paths. Another example benefit is a reduction of shorts between adjacent bond wires, i.e., wire sweep—both at time of manufacture and during operation in the field. Still further, the various exemplary embodiments provide various secondary and tertiary benefits such as, for example, reduction in overhead, such as material costs, which would otherwise be required to overcome wire sweep and other manufacturing issues, as well as overcome signal integrity issues.

It will be understood that high speed signal integrity for single-ended or differential signal is influenced by several parameters, including: (i) package parasitics such as self- and mutual inductances, series resistance, and capacitances, and (ii) device electrical characteristics such as receiver inputs, line driver, and switch impedances. As illustrative example, in a switch device implemented as a packaged IC die, using bond wire connections from the package to the die, if a bond wire connecting the package to the bond pad of the die is too long, the switch device will typically attenuate high frequency components of a signal by adding losses in the signal path. As another illustrative example, impedance discontinuities such as, for example, those occurring typical mismatches at interfaces between bond wires, vias, and package leads, often cause reflections that degrade the electrical signal and thereby reduce its frequency response (or AC bandwidth).

In overview, the various exemplary embodiments, employing a described algorithm for segmentation of a given circuit into multiple segments, layout of each segment on its own chip, and a selective positioning of each of the multiple simulated chips on a simulation of a package substrate, employing a simulation model generating the characteristic impedance of each bond wire connection with respect to chip location, provide for controlling the lengths of the bond wires. By controlling the length of the bond wire, the inductance L can be optimized to match the PCB transmission line.

As will be described in greater detail at later sections, a one optimization objective of various exemplary embodiments is a close match at the interface between the PCB transmission line and the external terminal of the chip package in their respective characteristic impedances, and no impedance mismatches along the transmission path extending from the chip package terminals to the I/O ports of the IC chips within the package. As will be understood, the various exemplary embodiments thereby provide, among other features and benefits, significantly reduced signal reflection at junctions such as, for example, between the package terminal and the PCB transmission lines, as well as between the package bond pad and the bond wire that connects to the IC chip. This in turn provides, among other benefits and features, significantly reduced loss of high-speed signal, and improved frequency response.

Another optimization objective in accordance with the various exemplary embodiments is substantial elimination of bond wires having greater than a given length.

As will be further understood from the more detailed description at later sections, the various exemplary embodiments provide an efficient and flexible means for optimizing these parameters, including providing for control of parameter values at the time of manufacture and/or providing for compensation of certain of these impedance-related parameters, including setting values and/or related signal path impedances to a given range of uniformity—without substantial added cost or design complexity.

One illustrative example electrical circuit readily implemented according to one or more of the exemplary embodiments is a high bandwidth Q:R switch, having Q multi-bit input ports and R multi-bit output ports, typically with one or more control lines for selectively connecting the input port to one or (assuming a 1:2 switch, for example) the other of the output ports. The number of bits per port may be an arbitrary value N such as, for illustrative example, N=8, or eight bits per port. According to conventional arts, a 1:2 switch, having one eight-bit input port and two eight-bit output ports is readily implemented as a single chip IC device, employing for example one or more of the various conventional pass transistor circuits and equivalents well known to persons of ordinary skill in the signal switching and IC arts. FIG. 1, which was previously described, depicts such an example. As also described above, such conventional single chip implementations of, for example, Q:R switches have shortcomings.

One illustrative example of practices according to one or more various exemplary embodiments will now be described, for purposes of illustration of certain features and aspects. As will be understood, the certain features and aspects include, but are not limited to, selectable bond wire lengths and set impedances, not provided by the conventional art.

To provide better focus on novel aspects, this illustrative example is described as a functional equivalent of the FIG. 1 depicted 2:1 switch. The example will be described in general overview, sufficient to provide persons of ordinary skill in the art a description of various exemplary embodiments sufficient to enable such persons to practice accordingly. It will be obvious to such persons that the inventive concepts are not limited to Q:R switches.

Referring to FIG. 1, as previously described, it is seen that a typical conventional art 1:2 switch, such as the depicted example, may have unequal length bond wires, some lengths being integer multiples of others, causing problems such as, for example, impedance mismatch. According to one aspect of one exemplary embodiment a circuit such as the 1:2 implemented by the conventional art FIG. 1 example is segmented into at least two segments. The end objective of the segmentation is to fabricate each segment on a stand-alone chip, in a manner such that, according to one aspect, each of the chips has a subset of the circuit's signal I/O points, each in turn connected to a bond wire pad on the chip. An arrangement for the chips on the substrate support surface of the chip package is then calculated, this arrangement being based on the arrangement of the bond wire pads on that chip and the bond wire pads on the package, such that the length of each of the bond wires provides a transmission line meeting a given characteristic impedance. These may, according to one aspect, all be the same value. These may, according to another aspect, be different values such as, for example, connecting to PCB transmission lines having respectively different impedances.

Since the circuit segmentations according to various exemplary embodiments place segments of the circuit on respective individual IC chips, the chips may be positioned on the substrate of the package independently of one another. In addition, according to one aspect there is provided, for each of the independent chips, a latitude in selecting the arrangement and positioning of the circuit I/O points, as well arranging the bond wire pads connecting to these circuit I/O points. As will be readily understood by persons of ordinary skill in the art in view of this disclosure, the degree of such latitude will typically be application-specific, but can be readily utilized by such persons to identify optimum segmentation of the circuit, layout of each chip, bond wire pad placement for each chip, as well as for the package, to obtain bond wire lengths providing a specified characteristic impedance for each of the packaged device's signal I/O ports.

It will be understood that the term "segment" has been arbitrarily selected from among various other terms having substantially the same meaning with respect to the present embodiments such as, for illustrative example, "portion," "section", "subsection," and has an intended meaning encompassing the plain meaning of all of these terms.

Such a switch, because of its requirement for carrying high bandwidth signals, must minimize the parasitics introduced into a high speed signal path.

Figure 4:
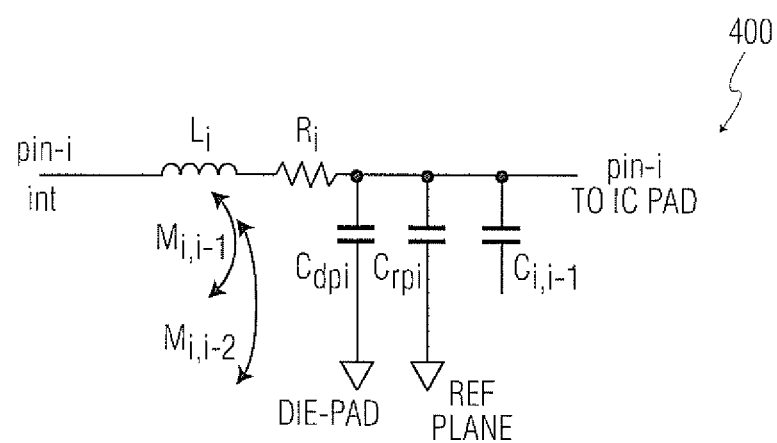
FIG. 4 depicts one example of one equivalent circuit model representing parasitics associated with typical bond wires, for practicing one or more I/O impedance optimizing circuit segmentation and die arrangement systems and methods according to various exemplary embodiments.

FIG. 4 shows one example of one simplified diagram illustrating typical parasitics added by a such a Q:R switch. The FIG. 4 diagram is only one illustrative example of one graphical representation of circuit parasitics, and is described in relation to a Q:R switch only for purposes of example. Persons of ordinary skill in the signal transmission and chip packaging arts can readily conform or modify the FIG. 4 diagram, or an equivalent, to other devices readily implemented according to the present embodiments. It will be understood that the switch device adds more parasitics (capacitances, inductors and resistances) in the single-ended or differential signal paths. These parasitics are contributed by both the package and semiconductor circuit, and cause impedance discontinuities in the high speed signal paths. As will be understood, the present embodiments provide means for matching the input connections to the parasitics, and thereby substantively reduce the discontinuities.

Figure 5:
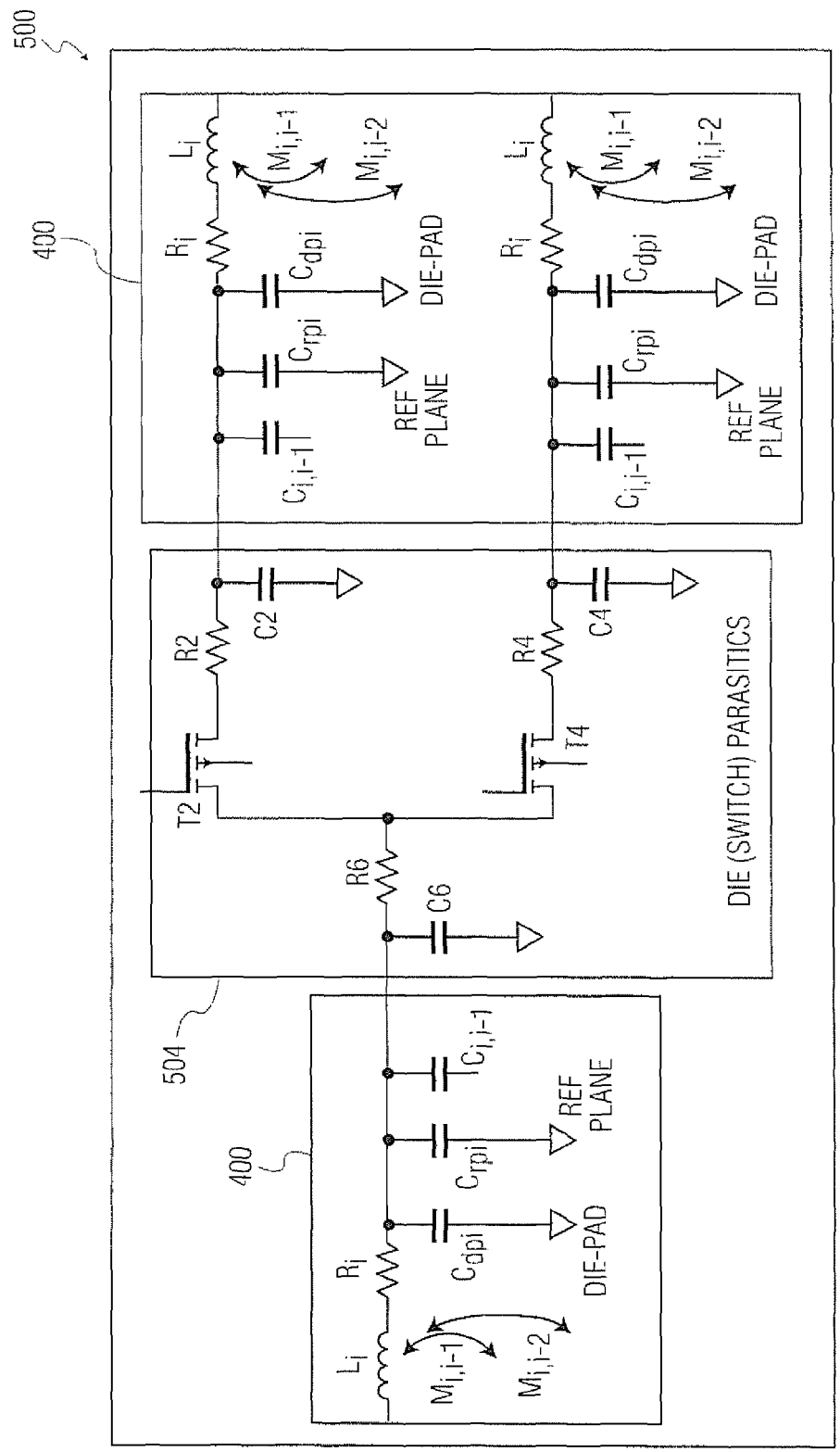
FIG. 5 depicts one example of FIG. 4 equivalent circuit model representing parasitics of example I/O lines of a packaged die employing bond wire transmission lines, for practicing one or more I/O impedance optimizing circuit segmentation and die arrangement systems and methods according to various exemplary embodiments.
Figure 6:
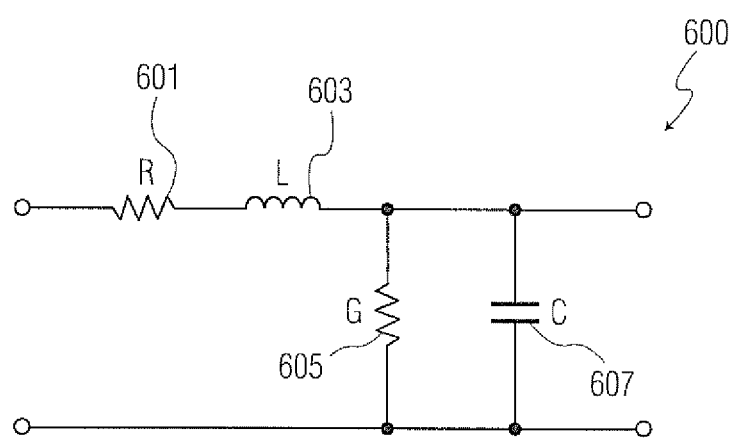
FIG. 6 depicts one example transmission line model of bond wires, for practicing one or impedance optimizing circuit segmentation and die arrangement systems and methods according to various exemplary embodiments.

FIGS. 4-6 depict example equivalent circuits representing parasitics, and one example transmission line model for bond wires, which may be used for a computer implemented method according to one or more of the various embodiments to identify a segmentation of a given circuit into multiple segments, for implementation as a corresponding multiple number of IC chips, one chip per segment, and to identify a positioning of bond pads on the chips and the bond pads on the package to achieve wire lengths for each of the high bandwidth wire connections that provide each with the desired characteristic impedance $Z_0$.

Referring to FIG. 4, this depicts one example of one equivalent circuit 400 to represent parasitics, for carrying out one or more impedance-driven die allocation and arrangement methods for multichip, optimized impedance die packaging according to one or embodiments.

FIG. 5 depicts one example of a circuit including a plurality of equivalent circuits 400 representing parasitics of example output, input, or input/output (I/O) lines of a package 500's die, for carrying out one or more impedance-driven die allocation and arrangement methods for multichip, optimized impedance die packaging, according to one or embodiments. In this example, the package's die includes a "Q" portion of the die, which may include capacitor C6 and resistor R6, and multiple "R" portions of the die, characterized in this illustration as two branches. The first branch may include switch T2, resistor R2, and capacitor C2. The second branch may include a switch T4, resistor R4, and capacitor C4. The equivalent circuits 400 may have different values for components based, for example, on the exemplary embodiment's matching of impedances.

FIG. 6 depicts one example transmission line model 600 of bond wires that may be employed for carrying out one or more impedance-driven die allocation and arrangement methods for multichip, optimized impedance die packaging according to one or embodiments. Referring to FIG. 6, the example transmission line model 600 assumes the transmission line is lossless, i.e., the resistance R 601 and the conductance G 605 are both negligibly small and therefore can be considered equal to zero, while accounting for both the inductance L 603 and capacitance C 607 per unit length. Persons of ordinary skill in the IC design and packaging arts, upon reading this disclosure, will readily understand that determining whether the FIG. 6 model is sufficient or is application-specific. Further, persons of ordinary skill in the art can as readily apply transmission line theory and the skills in modeling techniques known to such persons to modify the FIG. 6 model to accommodate non-negligible resistance and other non-ideal characteristics in a manner to practice, and to practice according to, various exemplary embodiments.

The characteristic impedance ($Z_0$) of a lossless transmission line (FIG. 6) may determined by Equation (1) below, where L 603 is inductance per unit length, e.g., Henrys per meter, and C 607 is the capacitance in, for example, Farads per meter. A real transmission line is not "lossless," as known to persons of ordinary skill in the arts pertaining to this invention, due to real wires having a real resistance. Referring to FIG. 6, this real resistance may be represented by, for example, the lumped resistance element R 601 which may represent such resistance in, for example, terms of ohms per meter. However, to focus this description and better assist such persons to understand the disclosed novel features and concepts sufficiently to practice the invention, R 601 may be assumed sufficiently negligible to be omitted. The characteristic impedance equation may still be used to optimize the values of the inductance 603 and the capacitance 607. Therefore, under this assumption:

$$Z_0 = \sqrt{\frac{L}{C}} \qquad \text{(Equation 1)}$$

One exemplary objective of one or more methods and devices according to the embodiments is maintaining the differential skew of signals on respective lines of differential transmission lines, e.g., two bond wires, connecting a package to one of the chips. For this purpose, a model of a differential pair transmission line formed of two bond wires connecting, for example, to any of the differential pairs (e.g., and of A0_N, A0_P . . . or A3_N, A3_P) appearing on the FIG. 11 example 4:2 switch, may be constructed from the FIG. 6 models. In one example, the bond wires may be sufficiently spaced from one another (and other bond wires) such that cross-coupling effects are negligible. As to actual values of coupling that correspond to "negligible," as well as the bond wire spacing necessary to meet such actual values, it is understood by persons of ordinary skill in the art that the former is application-specific and the second is, in part, signal frequency-specific, but both are readily identifiable and calculated by such persons by applying conventional know-how to the present disclosure.

Subject to the above-described assumption of negligible cross-coupling, the differential skew, Diff Skew, between such pairs of bond wires is readily derived using, for example, the below-defined Equation Nos. 2-5. In practicing according to the embodiments, the described calculations may be performed by a Field Solver or an equivalent simulation program, available from one or more commercial vendors. Persons of ordinary skill in the IC chip packaging arts can readily identify and select from among various commercially available Field Solver software systems, available from various vendors. Two illustrative examples of such commercially available Field Solver software systems, which are by no means limitative of the systems that persons of ordinary skill in the art may select from, and which are not intended as any statement by the present inventors as to the examples being preferable over any other Field Solver, are Maxwell 2D™, available from Ansoft, Inc., and Suites™ available from Sonnet® Software, Inc., North Syracuse, N.Y.

Continuing with this illustrative example of calculating the differential skew, Diff Skew, between respective differential signals on each line of a differential transmission line formed of two bond wires, the transmission line model for one of the bond wires of the two bond wire differential pair, such as the "positive" signal line, may be the above-described FIG. 6 model, using the values "L1" and "C1" for the respective inductance and capacitance. The impedance of this line may be labeled as the "odd mode" impedance, defined by Equation (2) below.

$$Zodd = \sqrt{\frac{L1}{C1}} \rightarrow \text{odd mode impedance} \qquad \text{(Equation (2))}$$

Similarly, the transmission line model for the other bond wire of the pair may be the same above-described FIG. 6 model, using the values "L2" and "C2" for its respective inductance and capacitance, and the impedance of this line may be labeled as the "even mode" impedance, defined by Equation (3) below.

$$Zeven = \sqrt{\frac{L2}{C2}} \rightarrow \text{even mode impedance} \quad \text{(Equation (3))}$$

Whereby the delay per signal is:

$ZDeven = \sqrt{L1 \circ C1} \rightarrow$ delay on "positive" bond wire, and  (Equation (4))

$ZDodd = \sqrt{L2 \circ C2} \rightarrow$ delay on "negative" bond wire.  (Equation (5))

The differential skew, Diff Skew is therefore

Diff Skew=(ZDodd−ZDeven)  (Equation (6))

Using the above-describe calculation of such values, or alternative or equivalent calculations or estimations of the differential skew, persons of ordinary skill may improve performance of the bond wires by iteratively calculating and modifying each bond wire impedance to minimize the differential pair skew. Under an exemplary embodiment, the equivalent die package 500, for example, may be improved, as an aspect of performance is the realization of lower differential signal pair skew. This is attributed to having each die and its associated die pads in closer proximity to the leads in the package. The upside is two-fold: short realized bond wire lengths and minimized differential pair skew.

Figure 7A:
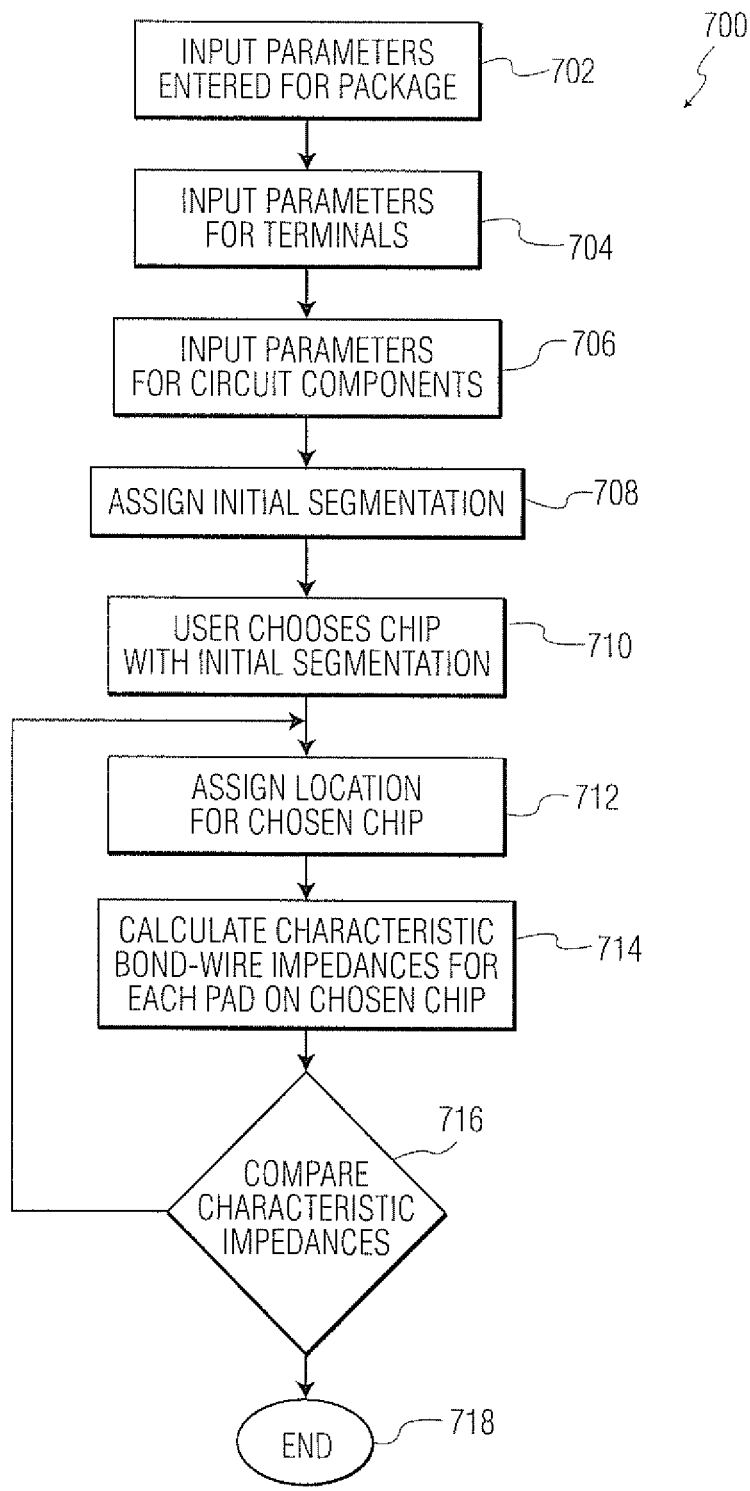
FIG. 7A shows one illustrative practice according to one or more exemplary embodiments for generating a multichip arrangement providing optimized impedance for a given segmentation.

FIG. 7A depicts one example practice 700 of one method according to one or more exemplary embodiments. Persons of ordinary skill in the art can, based on this disclosure, readily configure one or more commercially available simulation systems available from various vendors to perform the described practices, and other practices in accordance with the various exemplary embodiments.

Referring to FIG. 7A, at 702 a user inputs parameter values defining all physical attributes of a package relating to the characteristic impedance of the bond wires such as, for example, the dimension and geometric form of the inner perimeters surrounding the chip support. The format for entering the package parameters is a design choice, readily selected, defined and implemented by persons of ordinary skill in the art and, therefore, further detailed description is omitted. As will be obvious to persons of ordinary skill in the art based on this description, definitions of one or more particular packages may be defined and stored as objects (not separately depicted), by applying conventional object-based programming methods to this description. Next, at 704 the user inputs parameters describing given input/output terminals. Parameters at step 704 may include the designation of some parameters as high bandwidth. The user at 706 enters the parameters for constituent components, describing a given signal communication circuit. The circuit may be modeled in, for example SPICE.

Figure 7B:
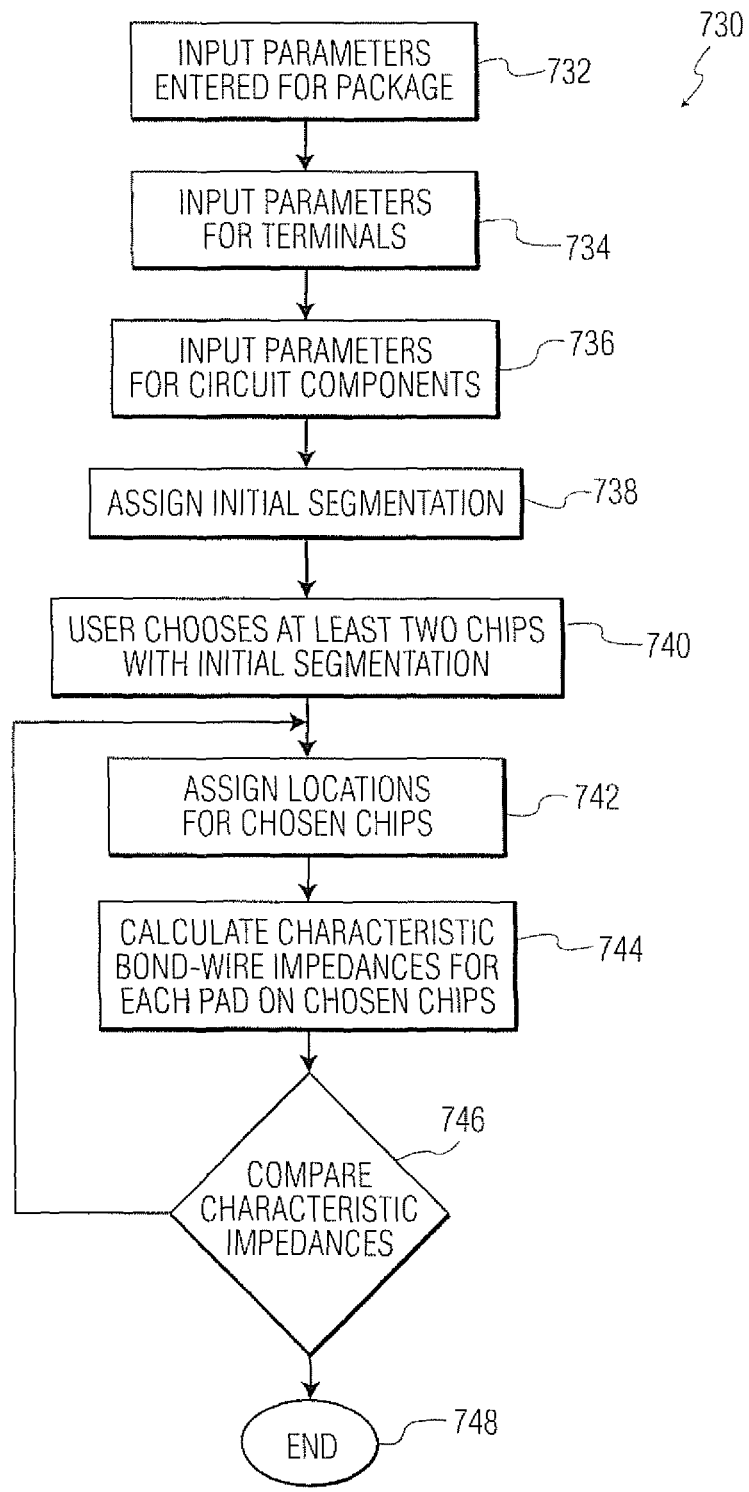
FIG. 7B shows one illustrative practice according to one or more exemplary embodiments for generating a multichip arrangement providing optimized impedance for a given segmentation.

With continuing reference to FIGS. 7A and 7B, next, at 708 the user assigns an initial segmentation of the signal communication circuit into an initial plurality of chips. Next, at 710, based on the initial segmentation, the user chooses least one of the initial plurality of chips having an initial assignment of a plurality of high bandwidth bond-wire pads. This may be input by the user. Alternatively, it may generated by the simulation system. Next, at 712, an initial assigning a location for at least one of the initial plurality of chips having an initial assignment of a plurality of high-bandwidth bond wire pad. Step 714 calculates a characteristic impedance for a bond-wire connection from each of the plurality of the high-bandwidth bond-wire pads of the at least one chip to a corresponding first terminal. At 716, a comparison is made between the calculated characteristic impedance and a given characteristic impedance, $Z_0$. If not equal to $Z_0$, then at step 717, laterally displacing the at least one chip in a direction depending on the difference in the characteristic impedances.

Referring to FIG. 7A, if the comparing at step 716 shows all characteristic impedances are within a given tolerance of $Z_0$, the process goes to step 718 and ends. If the comparing at step at step 716 indicates the characteristic impedances are not met the process return to step 712. Stated differently, the process 700 shown at FIG. 7A repeats the lateral displacement of at least one chip, followed by calculating the characteristic impedance, until either of the following conditions is detected: (i) the characteristic impedances are within a given tolerance from the given $Z_0$, or (ii) the given tolerance cannot be met using the initial segmentation.

Referring to FIG. 7B, a method 730 is similar to method 700 of FIG. 7A. Steps 732-738 may correspond to steps 702-708 of method 700. In step 740, based on the initial segmentation, the user chooses at least two of the initial plurality of chips having an initial assignment of a plurality of high-bandwidth bond-wire pads. These may also be input by the user. Alternatively, it may be generated by the simulation system. In step 742, locations are initially assigned for at least two of the initial plurality of chips having an initial assignment of a plurality of high-bandwidth bond-wire pads. In step 742, characteristic impedances are calculated from each of the plurality of high-bandwidth bond-wire pads of the at least two chips to corresponding terminals. In step 746, comparing at least the characteristic impedances of the at least two chips to given characteristic impedances, e.g., $Z_i$, $Z_j$, occurs. If the chip impedances are not equal to $Z_i$, $Z_j$, then at step 747, laterally displacing at least one of the at least two chips, depending on the difference in characteristic impedances.

The process 730 shown at FIG. 7B may repeat the lateral displacement of at least one chip, followed by calculating the characteristic impedances, until either of the following conditions is detected: (i) the characteristic impedances are within a given tolerance from the given $Z_i$ and $Z_j$, where method 730 ends at step 748, or (ii) the given tolerance cannot be met using the initial segmentation.

Figure 8:
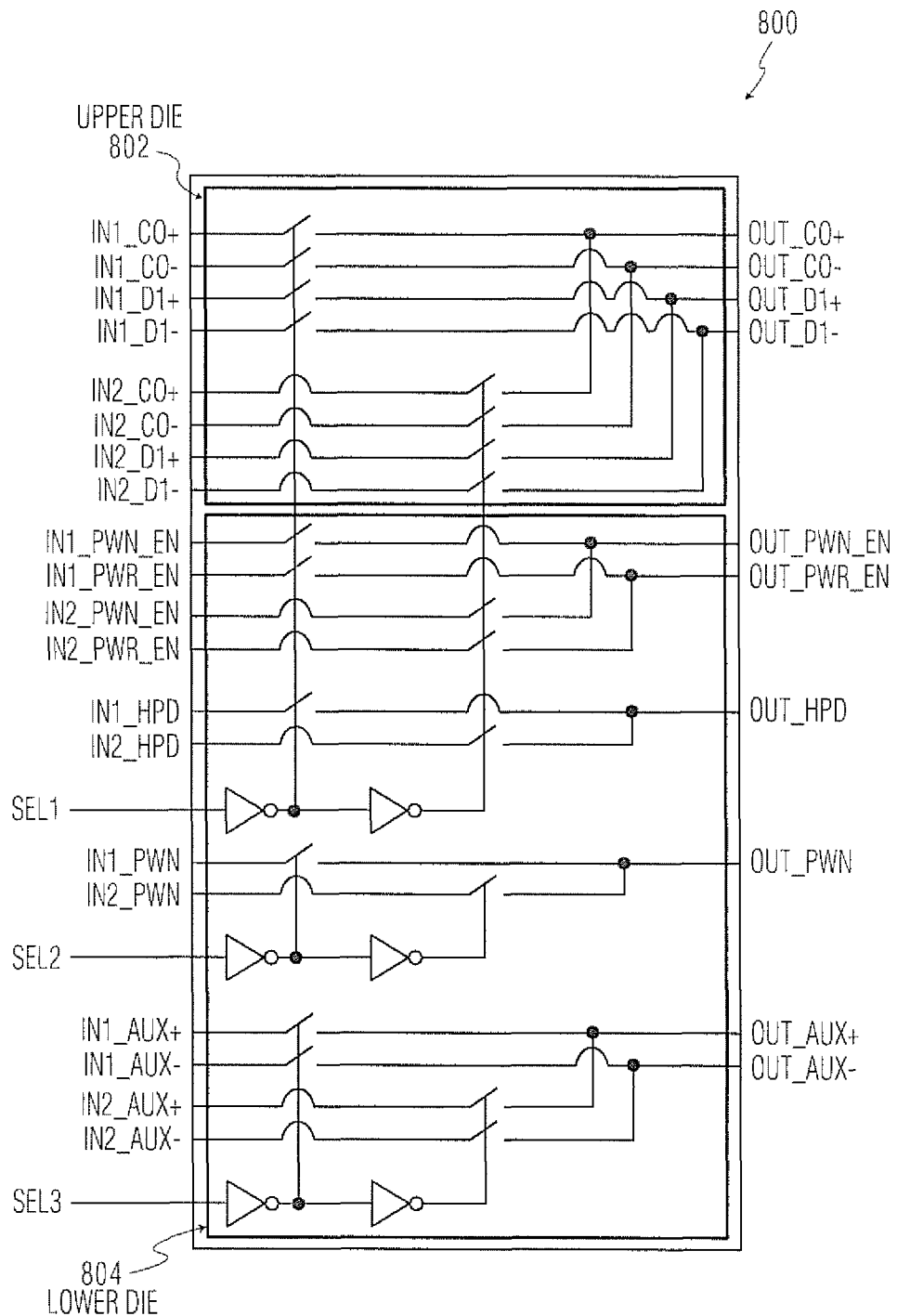
FIG. 8 shows one illustrative example multichip segmentation and allocation according to one or more embodiments, implementing an example high bandwidth Q:R switches.

FIG. 8 shows one example multichip segmentation 800 of a given signal communication circuit, applied for illustrative example, for implementing a replacement for the FIG. 2 exemplar prior art single-die high bandwidth Q:R switches. The FIG. 8 segmentation 800 may be based, at least in part, on one or more of the FIG. 4-6 models, or equivalent models. The segmentation 800 may be implemented through, for example, method 700 or method 730. Various methods may enable both the initial location and the movement of chips 802, 804 both vertically and laterally, based on, for example, matching to given impedances $Z_0$, $Z_i$, $Z_j$, and minimizing differential pair skew between the bond wires. The segmentation is performed to optimize the bond wire lengths, according to the given $Z_0$. Referring to FIG. 8, the depicted two-die segmentation of first segment 802 and second segment 804 is only for purposes of illustration. As will be apparent to persons of ordinary skill in the art upon reading this disclosure, a three-or-more die segmentation may be performed according to one or more of the embodiments.

Figure 9:
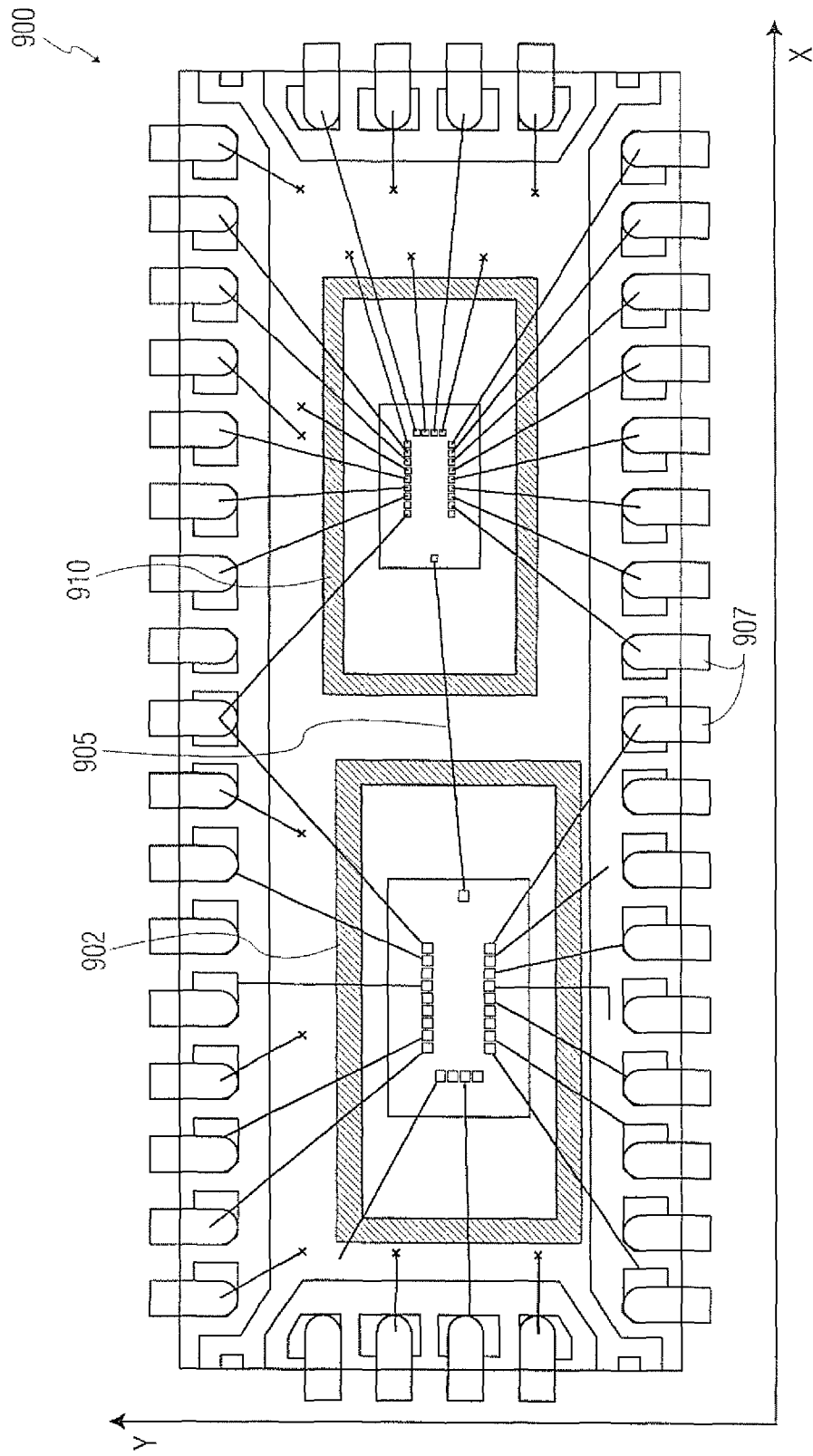
FIG. 9 is one elevational view of one two-chip optimized impedance Q:R switch, the example arrangement resulting from an example optimized chip positioning of the two die segmentation example illustrated at FIG. 8.

FIG. 9 is one elevational view of a die package 900. Die package 900 may be a two-chip optimized impedance replacement of, for example, the FIG. 3 exemplar prior art single die high bandwidth Q:R switches 34. The depicted example arrangement results from an example optimized chip positioning of the two die segmentation example 802, 804 and based, at least in part, on one or more of the FIGS. 4-6 models, yielding bond-wire lengths providing given characteristic impedance high-bandwidth switch transmission lines. Die package 900 may include two chips 902, 910 that are separated from each other and with locations closer to the package leads 907 than chip 32 in die package 34 of FIG. 3. The two chips, 902, 910 may be of the same or different size, and may have an equal or non-equal quantity of bond-wire pads and/or bond wires, as may be defined by an initial segmentation. The two chips 902, 910 may be connected through a conduit 905. The conduit 905 may be, for example, a jumper wire or a high-speed wire to enable a connection between the first chip 902 and the second chip 910 without an appreciable loss of performance in comparison with the die package 34. A person of ordinary skill in the art would know of equivalent conduits or connection pieces to enable connectivity between the first chip 902 and the second chip 910 (e.g., one or more traces between the chips).

Figure 10:
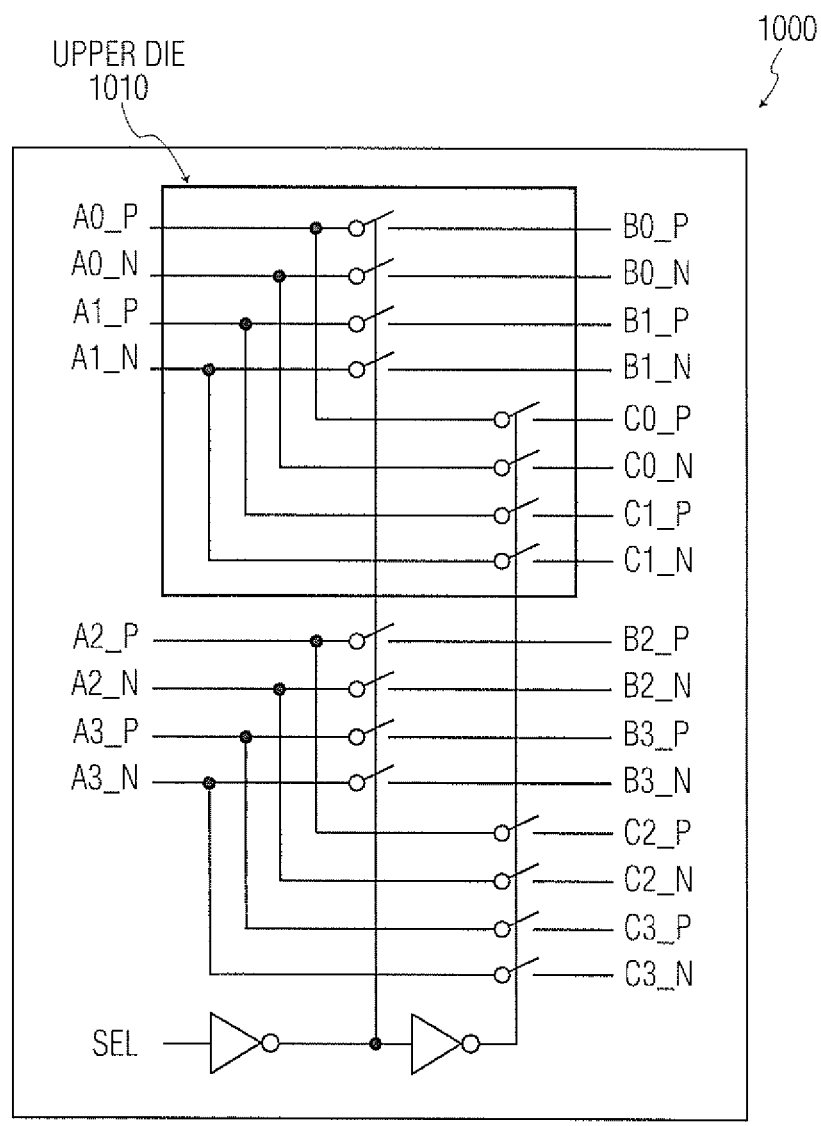
FIG. 10 shows one example upper die of one example two-die high bandwidth Q:R switch segmentation and allocation based in part on one or more of the FIGS. 4-6 or equivalent models, for practicing one or more impedance-driven die allocation and arrangement methods for multichip, optimized impedance die packaging according to one or more embodiments.
Figure 11:
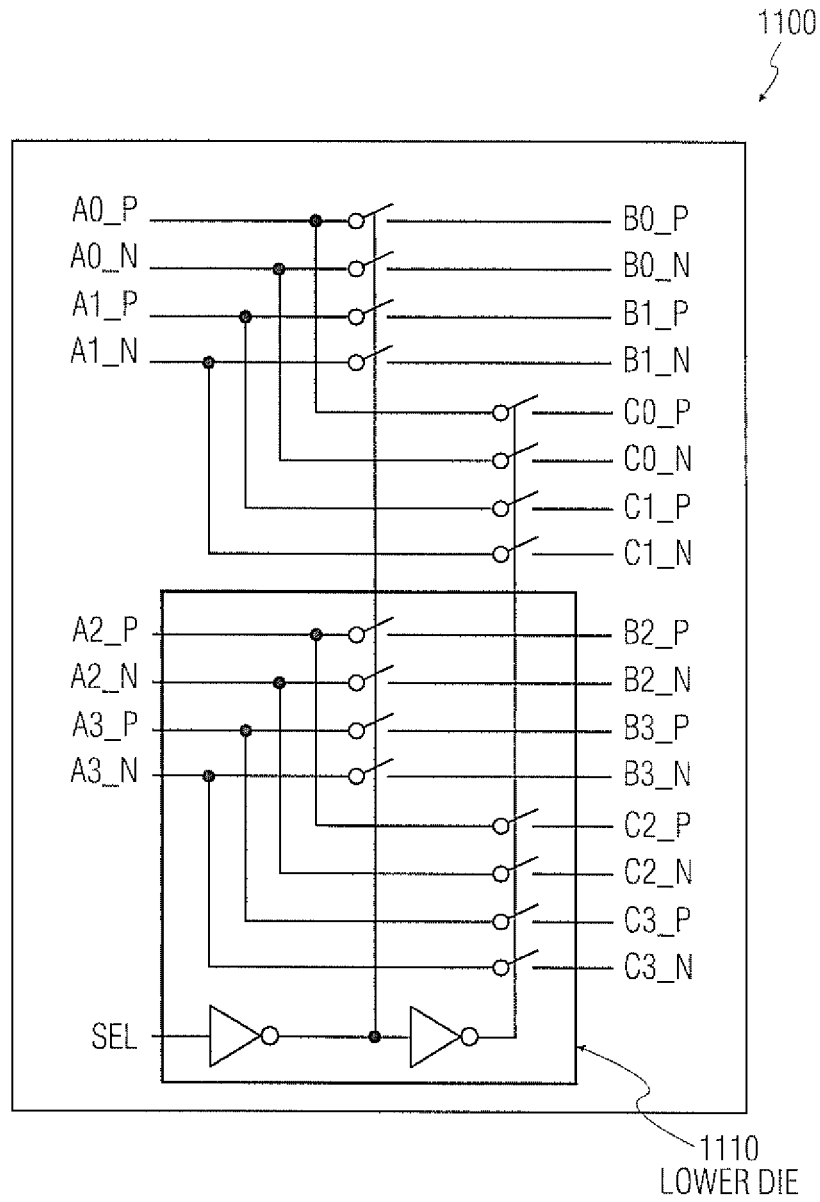
FIG. 11 shows one example lower die of the FIG. 10 example two-dies segmentation and allocation.

FIG. 10 shows one example upper die 1010 of one example two-die segmentation and allocation 1000, applied for illustrative example, for implementing a replacement for the FIG. 1 exemplar prior art single die high bandwidth Q:R switches, segmentation and allocation based in part on one or more of the FIGS. 4-6 models, or equivalent models, for practicing one or more impedance-driven die allocation and arrangement methods for multichip, optimized impedance die packaging according to one or more embodiments. Similarly, FIG. 11 shows one example lower die 1110 of an example two-die segmentation and allocation 1100. It will be understood that the terms "upper" and "lower" are only arbitrary labels and not any structural or functional limitations. Referring to FIGS. 8-11, it is seen that segmentation according to the exemplary embodiments may or may not result in each of the chips being structurally different from one another.

Figure 12:
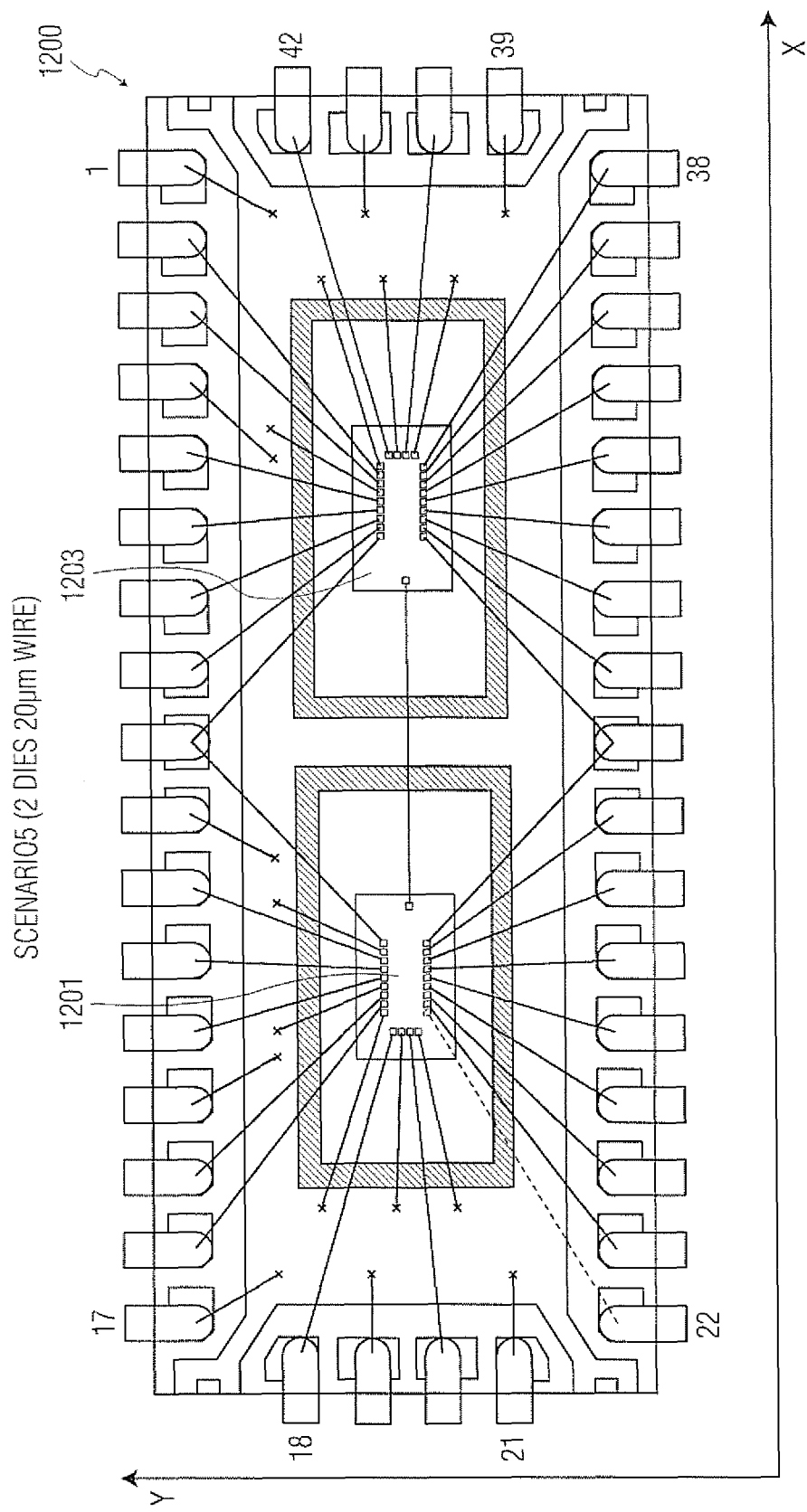
FIG. 12 is one elevational view of one two-chip optimized impedance, high bandwidth Q:R switch, resulting from an example optimized chip positioning of the two die segmentation of FIGS. 10-11.

FIG. 12 is one elevational view of one two-chip optimized impedance replacement of, for example, the FIG. 1 exemplar prior art single die high bandwidth Q:R switches. The example arrangement 1200 results from an example optimized chip positioning of the two die segmentation of FIGS. 9-10 based, at least in part, on one or more of the FIGS. 4-6 models, yielding bond-wire lengths providing given characteristic impedance high bandwidth switch transmission lines. The chips 1201, 1203 may or may not be of equal size and may be based, for example, on the number of die pads used.

Figure 13:
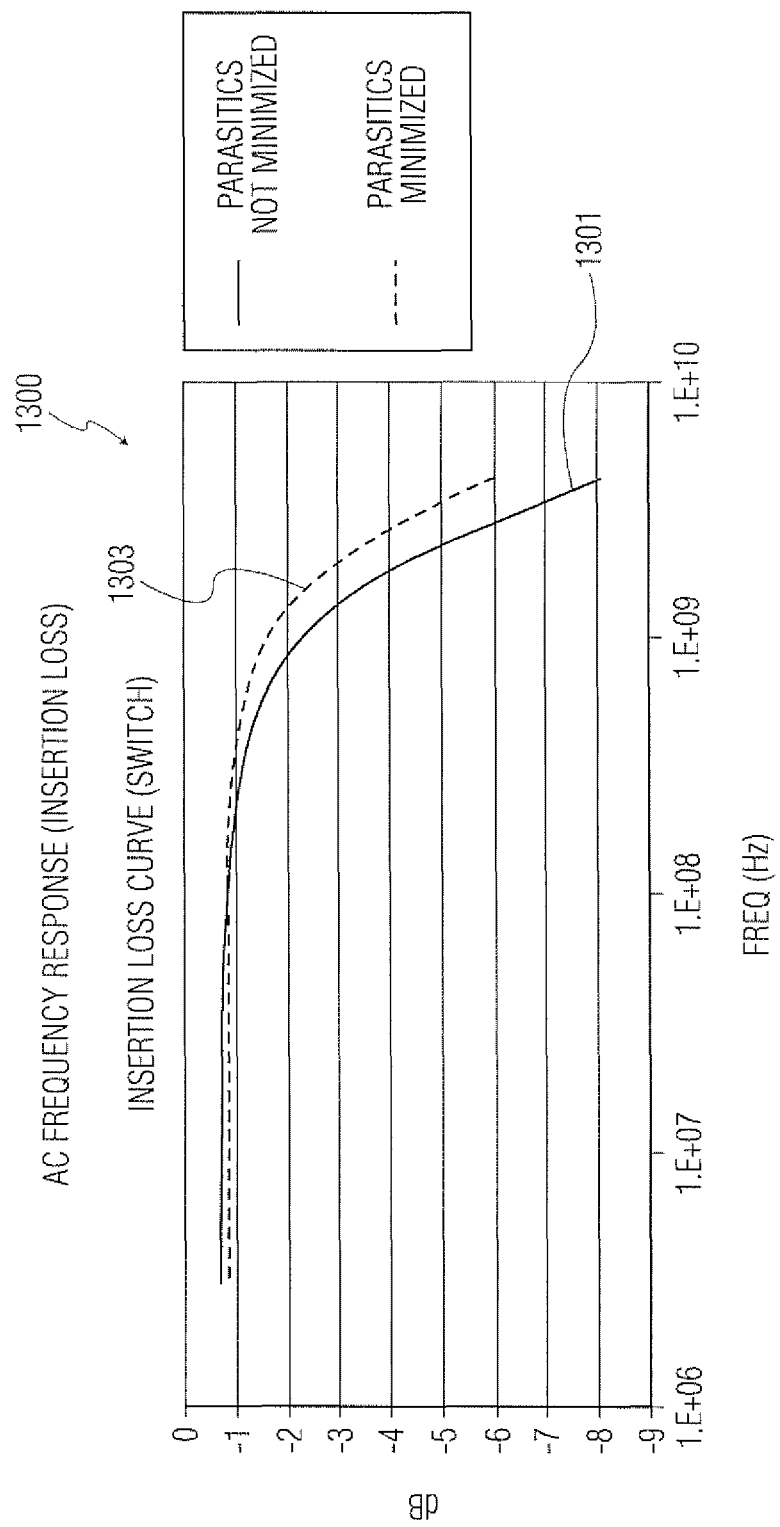
FIG. 13 depicts one prophetic insertion loss improvement, reflecting an exemplar of computer simulations of a two-chip optimized impedance bandwidth Q:R switches such as depicted at FIGS. 10-12.

FIG. 13 depicts one prophetic insertion loss improvement 1300, reflecting an exemplar of computer simulations of a two-chip optimized impedance bandwidth Q:R switches, such as switches 1000, 1100, and 1200, as depicted at FIGS. 10-12. Such loss improvement 1300 may illustrates, for example, a target frequency range to minimize loss, with parasitics, as depicted in line 1301, or with minimized parasitics, as depicted in line 1303.

Figure 14:
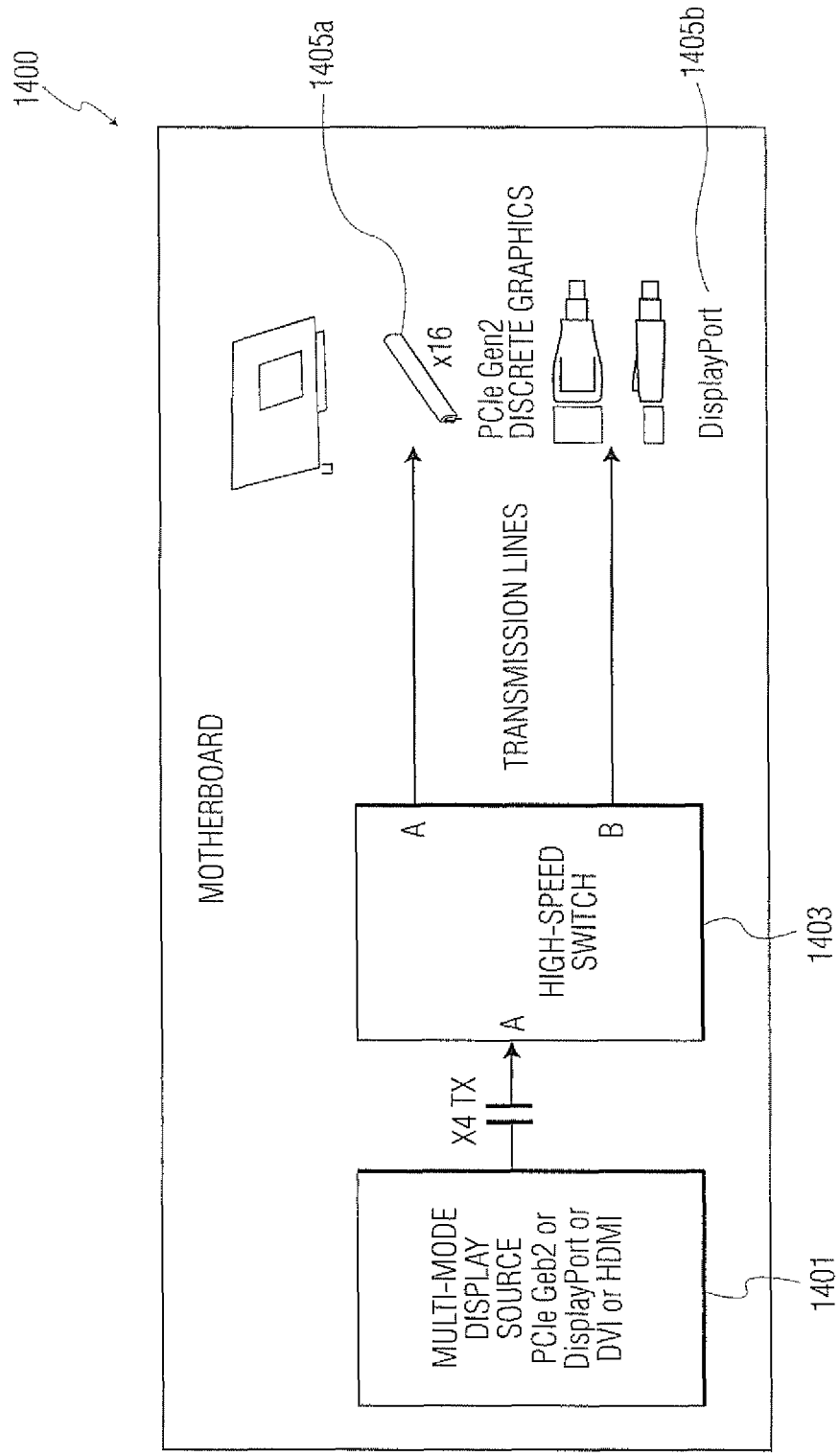
FIG. 14 is one example system application of one example high speed switch having, and/or constructed according to, one or more embodiments.

These various exemplary embodiments have large range of contemplated applications such as, for illustrative example, signal switching and distribution circuits for devices used in, or in association with, signal format and physical specification standards such as, but not limited to, SATA, DisplayPort, PCIe, USB, MIPI, HDMI, V-by-One, and Ethernet. FIG. 14 depicts one example system application 1400 of one example high speed switch having, and/or constructed according to, one or more embodiments. FIG. 14 may be a diagram of a system using a high-speed switch optimized for a Standard called "PCI express Gen 2 (5 Gbps)." Switch 1403 may be an embodiment of one of the switches disclosed herein, such as, for example, switch 900 or 1200. Switch 1403 may be used to control the connection between a source, such as multi-mode display source 1401, and a plurality of devices, such as graphics card 1405a and display port 1405b. A person of ordinary skill in the art would recognize equivalent applications for the switch 1403.

Figure 15:
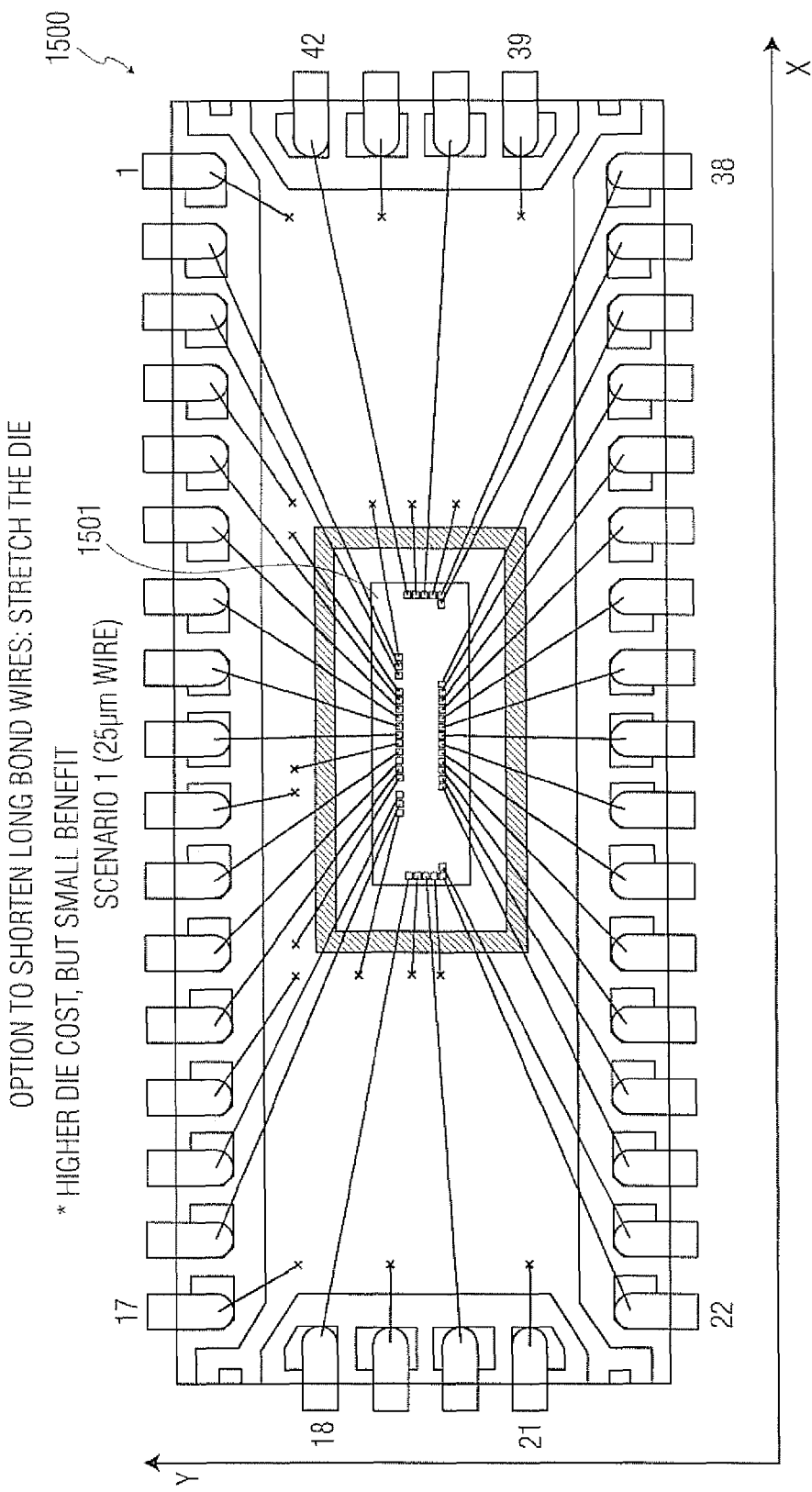
FIG. 15 depicts one illustrative example according to one stretched chip embodiment, providing bond wires having improved, but not optimized impedance.

FIG. 15 depicts one exemplary alternative embodiment, termed herein as a "stretched-chip embodiment" 1500, which employs segmentation similar to the above-described embodiments, but instead of fabricating each segment as a separate IC chip, fabricates the different segments at different respective regions of the single chip, with bond pads on chip 1501 connecting to the I/O ports of each circuit proximal to each of the terminals in each region of the die package 1500. The stretched chip 1501 is located such that it improves the position of bond pads on the package substrate for providing bond wires, but such a technique does not generally optimize impedance. The impedance cannot, typically, be optimized using the stretched-chip embodiment 1500, as practical limitations of chip dimensions may prevent achieving a positioning of the high-bandwidth terminals such that all of the bond-wire lengths, and hence their inductances, provide a characteristic impedance that is sufficiently close to the target impedance $Z_0$ to meet a given maximum allowable impedance mismatch. Another limitation may be that the cost of additional substrate, such as silicon, outweighs the benefit of bond-wire improvement.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We hereby claim:

1. An electrical device comprising:
   a chip package having a chip support substrate and plurality of package bond-wire pads disposed adjacent the chip support substrate;
   a plurality of semiconductor chips, each supported at a corresponding location on the chip support substrate, each of the semiconductor chips having a plurality of chip bond-wire pads; and
   a plurality of set impedance transmission lines, each having a characteristic impedance substantially equal to a given characteristic impedance $Z_0$, each of the transmission lines connecting a corresponding one of the plurality of chip bond wire pads of at least one of the semiconductor chips to a corresponding one of the package bond wire pads,
   wherein each of the set impedance transmission lines comprises a bond wire having a predetermined length setting the characteristic impedance $Z_0$.

2. The electrical device of claim 1, wherein the chip package supports a plurality of external terminal conductors, further comprising:
   a plurality of package input/output (I/O) transmission lines, each of said package I/O transmission lines connecting at least one of the external terminal conductors to at least one of the package bond-wire pads connected by one of the set impedance transmission lines to at least one chip bond-wire pads.

3. The electrical device of claim 2,
wherein the package bond wire pads include a plurality of package high-bandwidth bond wire pads, each of said plurality of package high-bandwidth bond wire pads connected to a corresponding one of the external terminal conductors by a corresponding one of the package I/O transmission lines,
wherein each of a plurality of the chip bond-wire pads of the first semiconductor chip is connected to a corresponding one of the package high-bandwidth bond-wire pads by a corresponding one of the set impedance transmission lines to form a corresponding plurality of first chip signal transmission paths, each of said plurality of chip bond-wire pads extending from a corresponding one of the external terminal conductors to a corresponding one of said plurality of the chip bond-wire pads of the first semiconductor chip,
wherein each of a plurality of the chip bond-wire pads of the second semiconductor chip is connected to a corresponding one of the package high-bandwidth bond-wire pads by a corresponding one of the set impedance transmission lines to form a corresponding plurality of second chip signal transmission paths, each of said plurality extending from a corresponding one of the external terminal conductors to a corresponding one of said plurality of the chip bond-wire pads of the second semiconductor chip.

4. The electrical device of claim 3, wherein at least one of the first chip signal transmission paths has a substantially continuous characteristic impedance from its corresponding external terminal conductor to its corresponding chip bond-wire pad, and at least one of the second chip signal transmission paths has a substantially continuous characteristic impedance from its corresponding external terminal conductor to its corresponding chip bond wire pad.

5. A multiport electrical device having a plurality of N multi-line ports, comprising:
a chip package having a chip support substrate and supporting a plurality of package bond pads disposed adjacent the chip support substrate;
a first semiconductor chip embodying a first sub-plurality of N lines for each of the N multi-line ports, and supporting a first chip bond pad corresponding to each of the first sub-plurality of N lines for each of the N multi-line ports embodied by said first chip;
a second semiconductor chip embodying a second sub-plurality of the lines for each of the N multi-line ports, and supporting a second chip bond pad corresponding to each of the second sub-plurality of the N lines for each of the N multi-line ports embodied by said second chip;
a plurality of first bond wires, each connecting one of said first bond pads to a corresponding one of said package bond pads, each of said first bond wires having a corresponding length providing a characteristic impedance substantially equal to a given $Z_0$; and
a plurality of second bond wires, each connecting one of said second bond pads to a corresponding one of said package bond pads, each of said second bond wires having a corresponding length providing a characteristic impedance substantially equal to said $Z_0$,
wherein said first semiconductor chip is supported at a first location on said package and said semiconductor is supported at a second location on said package.

6. The electrical device of claim 5,
wherein the first semiconductor chip embodies a first segment of a given P:Q switch circuit having P first ports and Q second ports and the second semiconductor chip embodies a second segment of the P:Q switch, Q and P being an integer greater than one, each of the P first ports selectively connectable to at least one of the Q second ports, each of the P first ports having a plurality of first bit ports and each of the Q second ports having a plurality of second bit ports,
wherein the first semiconductor chip embodies the P:Q switch for a first sub-plurality of the first bit ports and for a first sub-plurality of the second bit ports, and supports a first chip bond pad corresponding to each of the first sub-plurality of first bit ports and a chip bond pad corresponding to each of the first sub-plurality of second bit ports,
wherein the second semiconductor chip embodies the P:Q switch for a second sub-plurality of the first bit ports and for a second sub-plurality of the second bit ports, and supports a second chip bond pad corresponding to each of the second sub-plurality of first bit ports and a second chip bond pad corresponding to each of the second sub-plurality of second bit ports,
wherein, for each of said first chip bond pads, a corresponding one of said transmission lines connects said first chip bond pad to a corresponding one of said package bond pads, and
wherein, for each of said second chip bond pads, a corresponding one of said transmission lines connects said second chip bond pad to a corresponding one of said package bond pads.

7. The electrical device of claim 5,
wherein the package bond pads include a plurality of package high-bandwidth bond pads, each of said plurality of packaged high-bandwidth bond pads connected to a corresponding one of the external terminal conductors by a corresponding one of the package I/O transmission lines,
wherein each of a plurality of the chip bond pads of the first semiconductor chip is connected to a corresponding one of the package high-bandwidth bond pads by a corresponding one of the set impedance transmission lines to form a corresponding plurality of first chip signal transmission paths, each of said plurality extending from a corresponding one of the external terminal conductors to a corresponding one of said plurality of the chip bond pads of the first semiconductor chip,
wherein each of a plurality of the chip bond pads of the second semiconductor chip is connected to a corresponding one of the package high-bandwidth bond pads by a corresponding one of the set impedance transmission lines to form a corresponding plurality of second chip signal transmission paths, each of said plurality of second chip signal transmission paths extending from a corresponding one of the external terminal conductors to a corresponding one of said plurality of the chip bond pads of the second semiconductor chip.

8. The electrical device of claim 5, wherein at least one of the first chip signal transmission paths has a substantially continuous characteristic impedance from its corresponding external terminal conductor to its corresponding chip bond pad, and at least one of the second chip signal transmission paths has a substantially continuous characteristic impedance from its corresponding external terminal conductor to its corresponding chip bond pad.

9. A signal communication device, comprising:
a package having a given outer structure supporting a given plurality of first terminals, the first terminals for carrying high-bandwidth signals, and at least one second terminal, the package having a chip support substrate;

a first semiconductor structure, supported at a first location on the chip support substrate, having a first high-bandwidth circuit segment and a plurality of high-bandwidth chip first conductor pads connected to the first circuit segment;

a second semiconductor structure supported at a second location on the chip support substrate, the first location being different from the second location, having a second circuit segment and at least one second chip conductor pad connected to the second circuit segment;

a plurality of first high-bandwidth bond wires connecting a corresponding plurality of the high-bandwidth first chip conductor pads to a corresponding plurality of the first terminals; and at least one second bond wire connecting at least one second chip conductor pad to a corresponding second terminal, wherein the relation of the first location, locations of the plurality of high-bandwidth chip first conductor pads, and locations of first terminals are set such that each of the plurality of first high-bandwidth bond wires has a length providing a characteristic impedance of each of the first high bandwidth bond wires is within a given tolerance of a given characteristic impedance $Z0$.

* * * * *